(12) United States Patent
Eom et al.

(10) Patent No.: US 7,936,054 B2
(45) Date of Patent: May 3, 2011

(54) MULTI-CHIP PACKAGE

(75) Inventors: Joo-yang Eom, Gyeonggi-do (KR); Min-hyo Park, Gyeonggi-do (KR); Seung-yong Choi, Seoul (KR)

(73) Assignee: Fairchild Korea Semiconductor Ltd., Bucheon-Si, Gyeonggi-do (KR)

( * ) Notice: Subject to any disclaimer, the term of this patent is extended or adjusted under 35 U.S.C. 154(b) by 0 days.

(21) Appl. No.: 12/316,367

(22) Filed: Dec. 10, 2008

(65) Prior Publication Data

US 2009/0174044 A1    Jul. 9, 2009

(30) Foreign Application Priority Data

Dec. 13, 2007    (KR) .................. 10-2007-0129964

(51) Int. Cl.
*H01L 23/495* (2006.01)

(52) U.S. Cl. .............. 257/675; 257/676; 257/E23.08; 257/E23.141; 257/E21.502

(58) Field of Classification Search ............ 257/675, 257/676, E23.08, E23.141, E21.502; 438/127, 438/107

See application file for complete search history.

(56) References Cited

U.S. PATENT DOCUMENTS

| | | | |
|---|---|---|---|
| 4,731,701 A | 3/1988 | Kuo et al. | |
| 4,751,199 A | 6/1988 | Phy | |
| 4,772,935 A | 9/1988 | Lawler et al. | |
| 4,791,473 A | 12/1988 | Phy | |
| 4,796,080 A | 1/1989 | Phy | |
| 4,830,820 A * | 5/1989 | Itoh et al. ............... 419/23 |
| 4,839,717 A | 6/1989 | Phy et al. | |
| 4,890,153 A | 12/1989 | Wu | |
| 5,327,325 A | 7/1994 | Nicewarner, Jr. | |
| 5,646,446 A | 7/1997 | Nicewarner, Jr. et al. | |
| 5,650,361 A * | 7/1997 | Radhakrishnan ............ 438/779 |
| 5,703,399 A | 12/1997 | Mujamdar et al. | |
| 5,744,863 A * | 4/1998 | Culnane et al. ............... 257/712 |
| 5,776,797 A | 7/1998 | Nicewarner, Jr. et al. | |
| 5,785,799 A * | 7/1998 | Culnane et al. ............ 156/379.7 |
| 6,133,634 A | 10/2000 | Joshi | |
| 6,329,706 B1 | 12/2001 | Nam | |
| 6,432,750 B2 | 8/2002 | Jeon et al. | |
| 6,489,678 B1 | 12/2002 | Joshi | |
| 6,556,750 B2 | 4/2003 | Constantino et al. | |
| 6,566,749 B1 | 5/2003 | Joshi et al. | |
| 6,574,107 B2 | 6/2003 | Jeon et al. | |
| 6,621,152 B2 | 9/2003 | Choi et al. | |
| 6,627,991 B1 | 9/2003 | Joshi | |
| 6,642,738 B2 | 11/2003 | Elbanhawy | |
| 6,645,791 B2 | 11/2003 | Noquil et al. | |
| 6,674,157 B2 | 1/2004 | Lang | |
| 6,683,375 B2 | 1/2004 | Joshi et al. | |
| 6,696,321 B2 | 2/2004 | Joshi | |
| 6,720,642 B1 | 4/2004 | Joshi et al. | |
| 6,740,541 B2 | 5/2004 | Rajeev | |
| 6,756,689 B2 | 6/2004 | Nam et al. | |
| 6,774,465 B2 | 8/2004 | Lee et al. | |
| 6,777,800 B2 | 8/2004 | Madrid et al. | |

(Continued)

*Primary Examiner* — Zandra Smith
*Assistant Examiner* — Paul E Patton
(74) *Attorney, Agent, or Firm* — Kilpatrick Townsend & Stockton LLP

(57) ABSTRACT

A semiconductor package is disclosed. Particularly, a multi-chip package is disclosed, which can stably maintain insulation between a plurality of semiconductor chips and effectively release heat to the outside. The semiconductor package includes an insulation layer including a diamond layer formed by a chemical vapor deposition method between a lead frame or a heat sink and the semiconductor chips disposed thereon.

19 Claims, 3 Drawing Sheets

U.S. PATENT DOCUMENTS

| | | |
|---|---|---|
| 6,806,580 B2 | 10/2004 | Joshi et al. |
| 6,830,959 B2 | 12/2004 | Estacio |
| 6,836,023 B2 | 12/2004 | Joshi et al. |
| 6,867,481 B2 | 3/2005 | Joshi et al. |
| 6,867,489 B1 | 3/2005 | Estacio |
| 6,891,256 B2 | 5/2005 | Joshi et al. |
| 6,891,257 B2 | 5/2005 | Chong et al. |
| 6,893,901 B2 | 5/2005 | Madrid |
| 6,943,434 B2 | 9/2005 | Tangpuz et al. |
| 6,989,588 B2 | 1/2006 | Quinones et al. |
| 6,992,384 B2 | 1/2006 | Joshi |
| 7,022,548 B2 | 4/2006 | Joshi et al. |
| 7,023,077 B2 | 4/2006 | Madrid |
| 7,061,077 B2 | 6/2006 | Joshi |
| 7,061,080 B2 * | 6/2006 | Jeun et al. ............... 257/676 |
| 7,081,666 B2 | 7/2006 | Joshi et al. |
| 7,122,884 B2 | 10/2006 | Cabahug et al. |
| 7,154,168 B2 | 12/2006 | Joshi et al. |
| 7,157,799 B2 | 1/2007 | Noquil et al. |
| 7,176,506 B2 * | 2/2007 | Beroz et al. ............... 257/232 |
| 7,196,313 B2 | 3/2007 | Quinones et al. |
| 7,199,461 B2 | 4/2007 | Son et al. |
| 7,208,819 B2 | 4/2007 | Jeun et al. |
| 7,215,011 B2 | 5/2007 | Joshi et al. |
| 7,217,594 B2 | 5/2007 | Manatad |
| 7,242,076 B2 | 7/2007 | Dolan |
| 7,256,479 B2 | 8/2007 | Noquil et al. |
| 7,268,414 B2 | 9/2007 | Choi et al. |
| 7,271,497 B2 | 9/2007 | Joshi et al. |
| 7,285,849 B2 | 10/2007 | Cruz et al. |
| 7,315,077 B2 | 1/2008 | Choi et al. |
| 7,332,806 B2 | 2/2008 | Joshi et al. |
| 7,371,616 B2 | 5/2008 | Jereza |
| 7,439,613 B2 | 10/2008 | Joshi et al. |
| 7,501,702 B2 | 3/2009 | Joshi et al. |
| 7,504,281 B2 | 3/2009 | Joshi |

\* cited by examiner

MULTI-CHIP PACKAGE

CROSS-REFERENCES TO RELATED APPLICATIONS

This application claims the benefit of Korean Patent Application No. 10-2007-0129964, filed on Dec. 13, 2007, in the Korean Intellectual Property Office, the disclosure of which is incorporated herein in its entirety by reference.

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

1. Field of the Invention

The present invention relates to a semiconductor package, and more particularly, to a multi-chip package including one or more semiconductor chips.

2. Description of the Related Art

In a general semiconductor package, one or a plurality of semiconductor chips are encapsulated with an epoxy mold compound (EMC) for protection, and are mounted on a printed circuit board (PCB).

It is desirable for electronic devices to have high speed, high capacity and high integration, as the demand for smaller and lightweight power devices as (e.g., applied to cars, industrial devices) is constantly increasing. Also, power devices also desirably have low heat generation, high heat dissipation, and high reliability. An improved multi-chip power module package in which a plurality of semiconductor chips is used in a single semiconductor package is desirable.

U.S. Pat. No. 5,703,399, assigned to Mitsubishi, discloses one type of power semiconductor module package. The semiconductor package has a structure in which a plurality of semiconductor chips constituting a power circuit and a control circuit are mounted on a lead frame. An EMC having good thermal conductivity is used at a lower portion of the lead frame, and a heat sink formed of copper (Cu) is under the lead frame and is separated slightly therefrom, so that heat generated from a power circuit chip can be effectively released to the outside.

The power semiconductor module package has the following limitations.

First, the EMC is filled between a backside of the lead frame and the heat sink of Cu in order to maintain an insulating characteristic. The EMC limits the ability of the power circuit chip to release heat to the outside of the power semiconductor module package.

Secondly, the fabrication process of the power semiconductor module package is complicated because two EMCs having different properties are used for one power semiconductor module package.

Thirdly, if a plurality of semiconductor chips is mounted on the lead frame, it is not easy to insulate the semiconductor chips from each other because of conductivity of the lead frame. Particularly, this problem becomes worse when the power semiconductor module package is used in a high-power device.

To solve the aforementioned limitations, a method of fabricating a power semiconductor module package employing an insulation substrate such as a direct bonding copper (DBC) substrate or an insulated metal substrate (IMS) substrate is being proposed.

The DBC substrate includes Cu layers respectively attached to both sides of an insulation ceramic layer, and has been known for its relatively good heat release characteristic. However, the DBC substrate is expensive to produce, because the Cu layer is partially formed according to a designed pattern.

The IMS substrate includes a polymer insulation layer formed on a top surface of an aluminum substrate, and a Cu layer formed in a pattern on the polymer insulation layer. The IMS substrate has a relatively low fabrication cost in comparison to the DBC substrate, but has a poor thermal characteristic and a poor insulation characteristic.

Therefore, it is desirable to implement a multi-chip package having an insulation structure with low thermal resistance and high electrical resistance without using the insulation substrate such as the DBC substrate or the IMS substrate.

Embodiments of the invention address the above problems, and other problems, individually and collectively.

SUMMARY OF THE INVENTION

The present invention provides a multi-chip package having an insulation structure with high electrical resistance and low thermal resistance without using an insulation substrate.

One embodiment of the invention is directed to a multi-chip package comprising: a lead frame comprising a surface; one or more semiconductor chips disposed on the surface of the lead frame, but electrically isolated from the lead frame; a substrate disposed on the one or more semiconductor chips and electrically connected to the one or more semiconductor chips; and an encapsulation material encapsulating the surface of the lead frame, the one or more semiconductor chips and the substrate.

Another embodiment of the invention is directed to a multi-chip package comprising: a heat sink comprising a surface; one or more semiconductor chips disposed on the surface of the heat sink, but electrically isolated from the heat sink; a substrate disposed on the one or more semiconductor chips and electrically connected to the one or more semiconductor chips; and an encapsulation material encapsulating the surface of the heat sink, the one or more semiconductor chips and the substrate.

Another embodiment of the invention is directed a multi-chip package comprising: a first semiconductor chip mounted on a top surface of a lead frame having conductivity; a second semiconductor chip mounted on the first semiconductor chip; an insulation layer interposed between the first semiconductor chip and the second semiconductor chip; a bonding structure electrically connecting the second semiconductor chip with the first semiconductor chip; and an encapsulation material encapsulating the top surface of the lead frame, the first semiconductor chip, the second semiconductor chip, the insulation layer and the bonding structure.

Other embodiments of the invention are directed to methods for forming the above-described semiconductor packages.

These and other embodiments of the invention are described in further detail below in the Detailed Description of the Invention, and with reference to the Figures.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
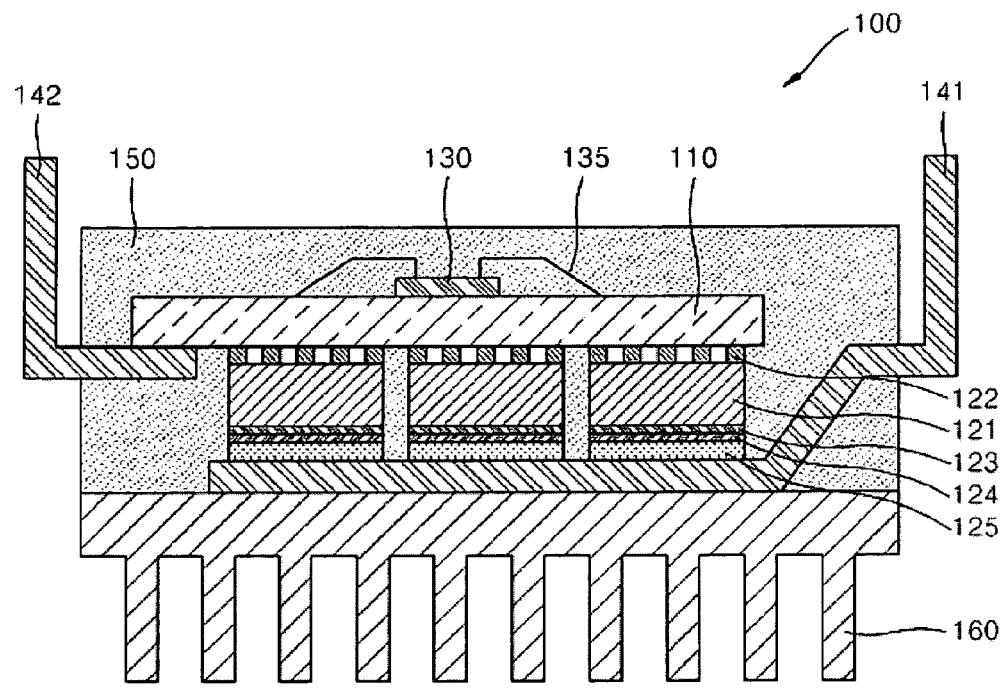
FIG. 1 is a cross-sectional view illustrating a multi-chip package according to an embodiment of the present invention.

Reference will now be made in detail to a number of exemplary embodiments, which are shown in the accompanying drawings. However, embodiments of the invention are not limited to the exemplary embodiments described herein, and other embodiments may be within the scope and spirit of the invention. In the drawings, the thicknesses of layers and regions may be exaggerated for clarity of illustration.

Like reference numerals refer to like elements throughout. It will be understood that when an element, such as a layer, a region, or a substrate, is referred to as being "on," another element, it may be directly on the other element or intervening elements may be present. Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section as discussed below, could be a second element, component, region, layer or section without departing from the teachings of the exemplary embodiments.

It is also understood that the term "electrically connected" may include a direct connection between two elements, as well as an indirect connection between two or more elements (i.e., with the presence of intervening elements).

FIG. 1 is a cross-sectional view illustrating a multi-chip package 100 according to an embodiment of the present invention.

Referring to FIG. 1, chips in a plurality of semiconductor chips 121 are mounted on a top surface of a first lead frame 141. The first lead frame 141 may be formed of a conductive material, e.g., Cu. To prevent a short between the chips in the plurality of semiconductor chips 121 through the first lead frame 141, the plurality of semiconductor chips 121 can be electrically insulated from each other and from the lead frame 141. The semiconductor chip 121 may include a power device and/or a control device. The power device may be applied to, e.g., a motor drive, a power-inverter, a power-converter, a power factor correction (PFC) or a display drive. The application examples of the power device are merely for describing embodiments of the present invention, and embodiments of the present invention are not limited by the examples. The semiconductor chip 121 may include a silicon chip, or any other type of semiconductor chip. The chips in the plurality of semiconductor chips 121 are illustrated in FIG. 1, but the present invention is not limited thereto and is applicable to the case of one semiconductor chip 121.

According to the current embodiment, an insulation layer 123 is interposed between a top surface of the first lead frame 141 and the semiconductor chip 121. The insulation layer 123 has high electrical resistance to electrically insulate the semiconductor chip 121 and the first lead frame 141 from each other. The insulation layer 123 can have low thermal resistance, i.e., high thermal conductivity, in order to efficiently release heat generated from the semiconductor chip 121 to the outside.

The insulation layer 123 may include a diamond layer. The diamond layer may be formed through a chemical vapor deposition method or a physical vapor deposition method.

For example, to form the diamond layer by the chemical vapor deposition method, a plasma chemical vapor deposition method under hydrogen gas atmosphere may be used. To form the diamond layer by the physical vapor deposition method, a laser ablation method may be used. The laser ablation method can achieve a simple device structure and grow crystal even at a relatively low substrate temperature because of high kinetic energy of particles emitted from a graphite target.

The insulation layer 123 may include a BeO layer or an AlN layer. The BeO layer or the AlN layer may also be formed by the physical vapor deposition method or the chemical vapor deposition method. Other types of inorganic layers may be used in other embodiments of the invention.

Table 1 below shows various characteristics of diamond, BeO, AlN and Cu formed by the chemical vapor deposition method.

TABLE 1

| Material | Young modulus ($10^{12}$ dynes/cm$^2$) | Resistivity ($\Omega$ cm) | Thermal expansion coefficient (ppm/° C.) | Thermal conductivity (W/cm ° C.) |
| --- | --- | --- | --- | --- |
| CVD diamond | 8.40 | $10^{16}$ | 1.2 | 21 |
| BeO | 1.01 | $10^{14}$ | 7.4 | 2.4 |
| AlN | 1.81 | $10^{14}$ | 3.2 | 2.2 |
| Cu | 1.10 | $1.7 \times 10^{-6}$ | 16.8 | 3.8 |

Referring to Table 1, the diamond layer formed by the chemical vapor deposition method can serve as an insulation material, because of its very high electrical resistance. It can contribute to external heat release in a package, because of its very high thermal conductivity. Accordingly, the insulation layer 123 according to the current embodiment of the invention may include a diamond layer formed by the chemical vapor deposition method. However, those specifically described materials of the insulation layer 123 are merely exemplary, and the present invention is not limited thereto. Also, materials with properties with ranges above or below the specific values in Table 1 may be used in embodiments of the invention in any suitable combination. For example, the insulation layer 123 may include a material that has a resistivity less than the value of CVD diamond and a thermal conductivity higher than that of CVD diamond.

The multi-chip package 100 includes a substrate 110 that is coupled to the plurality of semiconductor chips 121. The substrate 110 is electrically connected with the semiconductor chips 121. Examples of the substrate 110 may include a printed circuit board (PCB), a flexible printed circuit board (FPCB), a DBC and an IMS substrate, but the present invention is not limited to the described examples.

The semiconductor chip 121 and the substrate 110 may be electrically connected together by a bump 122 or a plurality of bumps formed on the semiconductor chip 121. The bump 122 may be formed of a metal or solder. In other embodiments, the semiconductor chip 121 and the substrate 110 may be electrically connected by a bonding wire instead of the bump 122. If the bonding wire is provided, a second metal layer (not shown) may be formed on the semiconductor chip 121.

A first metal layer 124 may be interposed between a top surface of the first lead frame 141 and the insulation layer 123. For example, the first metal layer 124 can include solder and can be used for soldering on the first lead frame 141. A die attach adhesive layer 125 may be interposed between the top surface of the first lead frame 141 and the insulation layer 123. The die attach adhesive layer 124 may be formed of, e.g., a solder or epoxy, but the present invention is not limited thereto.

In FIG. 1, the first metal layer 124 and the die attach adhesive layer 125 are illustrated, but both layers may or may not be used together. For example, in some embodiments, only one of the first metal layer 124 and the die attach adhesive layer 125 may be interposed between the insulation layer 123 and the first lead frame 141. In other embodiments, layers 123 and 124 need not be present.

In FIG. 1, another semiconductor chip 130 is mounted on the substrate 110, and they are electrically connected by a bonding wire 135. The additional semiconductor chip 130 may be a power device and/or a control device, but the present invention is not limited thereto.

The multi-chip package 100 also includes an encapsulation material 150. The encapsulation material 150 may encapsulate the top surface of the first lead frame 141, the semiconductor chips 121 and the substrate 110. The encapsulation material 150 may be formed to expose a bottom surface of the first lead frame 141 to the outside. The encapsulation material 150 may be an insulation resin, e.g., an EMC.

The bottom surface of the first lead frame 141 is exposed by the encapsulation material 150, and a heat sink 160, which contacts the exposed bottom side of the first lead frame 141, may be provided. The heat sink 160 may be coupled with a bottom surface of the encapsulation material 150 and the bottom surface of the first lead frame 141 by an adhesive layer and/or a mechanical coupling structure. The heat sink 160 may serve to quickly release heat generated from the semiconductor chip 121 including a power device.

The multi-chip package 100 may also include an optional second lead frame 142. The second lead frame 142 may contact the substrate 100 to allow for an external electrical connection. Thus, the multi-chip package 100 illustrated in FIG. 1 may be a dual in-line package (DIP) in which the attached lead frames 141 and 142 are aligned in two rows on both sides. In other embodiments, the semiconductor package could be a micro lead frame (MLP) type package.

The semiconductor package 100 illustrated in FIG. 1 may be formed using any suitable process, and some individual process steps are described above.

In some embodiments, the method for forming the package may comprise providing a lead frame 141 comprising a surface. The lead frame 141 may be formed using any suitable process including etching, or stamping.

After the lead frame 141 is formed, semiconductor chips 121 are attached to the surface of a lead frame 141, wherein the attached semiconductor chips are electrically insulated from each other to prevent a short. Before the semiconductor chips 121 are attached to the lead frame 141, at least one of the layers 123, 124, 125 may be formed on the semiconductor chips 121 and/or the lead frame 141 using the deposition processes mentioned above, or other deposition processes know in the art.

Before or after the lead frame 141 and the semiconductor chips 121 are attached together, a substrate 110 is attached to the plurality of semiconductor chips 121 using the bumps 122. The bumps 122 may be formed on the chips 121 or the substrate 100 prior to attachment.

After attaching the lead frame 141 and the substrate 110 to the semiconductor chips, the lead frame 141, the plurality of semiconductor chips 121 and the substrate 110 are encapsulated with an encapsulating material 150. Prior to encapsulation, various other elements, including elements 142, 130, 135, etc., may be attached to the substrate 110. After encapsulation, the heat sink 160 can be attached to the lead frame 141.

Figure 2:
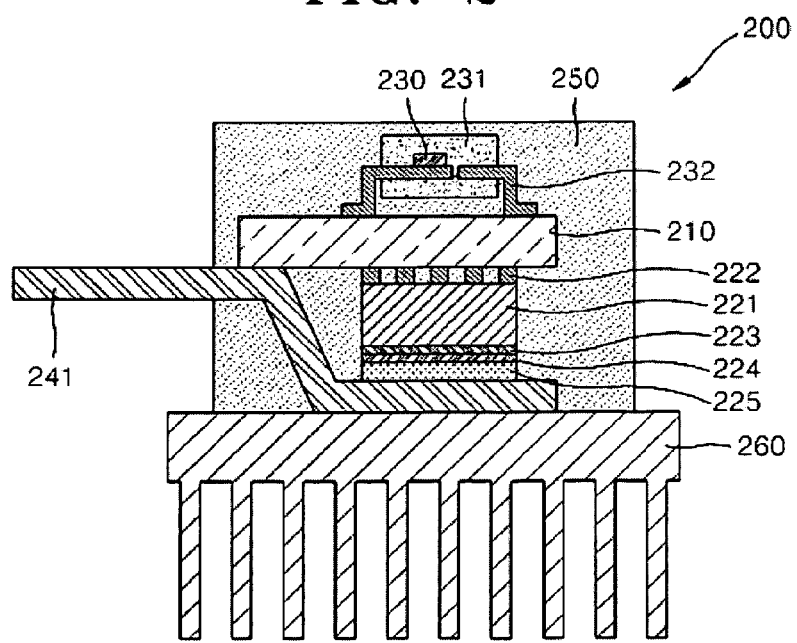
FIG. 2 is a cross-sectional view illustrating a multi-chip package according to another embodiment of the present invention.

FIG. 2 is a cross-sectional view illustrating a multi-chip package 200, according to another embodiment of the present invention.

Referring to FIG. 2, a semiconductor chip 221 is mounted on a top surface of a lead frame 241. The lead frame 241 is formed of a conductive material, e.g., Cu. The semiconductor chip 211 may include a power device and/or a control device. The power device may be applied to, e.g., a power-inverter, a power-converter, a PFC or a display drive. However, the application examples of the power devices are merely for describing the present invention, and the present invention is not limited thereto. The semiconductor chip 221 may include a silicon chip. One semiconductor chip 221 is illustrated in FIG. 2, but the present invention is also applicable to the case of a plurality of semiconductor chips.

According to the current embodiment, an insulation layer 223 is interposed between the top surface of the lead frame 241 and the semiconductor chip 221. The insulation layer 223 can have high electrical resistance to electrically insulate the semiconductor chip 221 and the lead frame 242 from each other. The insulation layer 223 can also have low thermal resistance, i.e., high thermal conductivity in order to efficiently release heat generated from the semiconductor chip 221 to the outside.

The insulation layer 223 may include a diamond layer. The diamond layer may be formed through a chemical vapor deposition method or a physical vapor deposition method.

For example, to form the diamond layer by the chemical vapor deposition method, a plasma chemical vapor deposition method may be used under hydrogen gas atmosphere. To form a diamond layer by the physical vapor deposition method, a laser ablation method may be used. The laser ablation method can achieve a simple device structure and grow crystal even at a relatively low substrate temperature because of high kinetic energy of particles emitted from a graphite target.

The insulation layer 223 may include a BeO layer or an AlN layer. The BeO layer or the AlN layer may also be formed by the physical vapor deposition method or the chemical vapor deposition method.

Table 1 above shows various characteristics of diamond, BeO, AlN and Cu formed by the chemical vapor deposition method. Referring to Table 1, the diamond layer formed by the chemical vapor deposition method can serve as an insulation material because of its very high thermal resistance and can contribute to external heat release of the package because of its very high thermal conductivity. Accordingly, the insulation layer 223 according to the current embodiment may include a diamond layer formed by the chemical vapor deposition method. However, those materials of the insulation layer 223 are merely exemplary, and the present invention is not limited thereto.

The multi-chip package 200 includes a substrate 210 on the semiconductor chips 221. The substrate 210 is electrically connected with the semiconductor chip 221. Examples of the substrate 210 may include a PCB, a FPCB, a DBC and IMS substrate, but the present invention is not limited to the described examples.

The semiconductor chip 221 and the substrate 210 may be electrically connected together by a bump 222 formed on the semiconductor chip 221. The bump 222 may be formed of a metal or solder. In other embodiments, the semiconductor chip 221 and the substrate 210 may be electrically connected together using a bonding wire instead of the bump 222. If a bonding wire is provided, a second metal layer (not shown) may be formed on the semiconductor chip 221.

A first metal layer 224 may be interposed between the top surface of the lead frame 241 and the insulation layer 223. For example, the first metal layer 224 can be used for soldering on the lead frame 241. A die attach adhesive layer 225 may be interposed between the top surface of the lead frame 241 and the insulation layer 223. The die attach adhesive layer 224 may be formed of, e.g., a solder or epoxy, but the present invention is not limited thereto.

In FIG. 2, the first metal layer 224 and the die attach adhesive layer 225 are illustrated, but may or may not be provided together. For example, in some embodiments, only one of the first metal layer 224 and the die attach adhesive layer 225 may be interposed between the insulation layer 223 and the lead frame 241. In other embodiments, neither layer 224 nor 225 need be present.

Another semiconductor chip 230 is mounted on the substrate 210 and is electrically connected by a connection member 232. The additional semiconductor chip 230 may be a power device and/or a control device, but the present invention is not limited thereto.

The multi-chip package 200 includes an encapsulation material 250. The encapsulation material 250 may encapsulate the top surface of the lead frame 241, the semiconductor chips 221 and 230 and the substrate 210. The encapsulation material 250 may be formed to expose a bottom surface of the lead frame 241 to the outside. The encapsulation material 250 may be an insulation resin, e.g., an EMC.

A bottom surface of the lead frame 241 is exposed by the encapsulation material 250, and a heat sink 260 contacts the exposed bottom surface of the first lead frame 241. The heat sink 260 may be coupled with a bottom surface of the encapsulation material 250 and the bottom surface of the lead frame 241 by an adhesive layer and/or a mechanical coupling structure. The heat sink 260 may serve to quickly release heat generated from the semiconductor chip 221 including a power device.

In the multi-chip package 200, the lead frame 241 contacts the substrate 210 for electrical connection. Thus, if the substrate 210 is not an insulation substrate such as a DBC substrate or an IMS substrate, a short may occur between the semiconductor chip 221 and the other semiconductor chip 230. Therefore, the insulation layer 223 can be disposed between the lead frame 241 and the semiconductor chip 221 can prevent the short.

The multi-chip package 200 illustrated in FIG. 2 may be a single in-line package in which the attached lead frame 241 is aligned in a row at one side.

The package 200 in FIG. 2 can be formed in a manner that is similar to the process described above with respect to FIG. 1.

Figure 3:
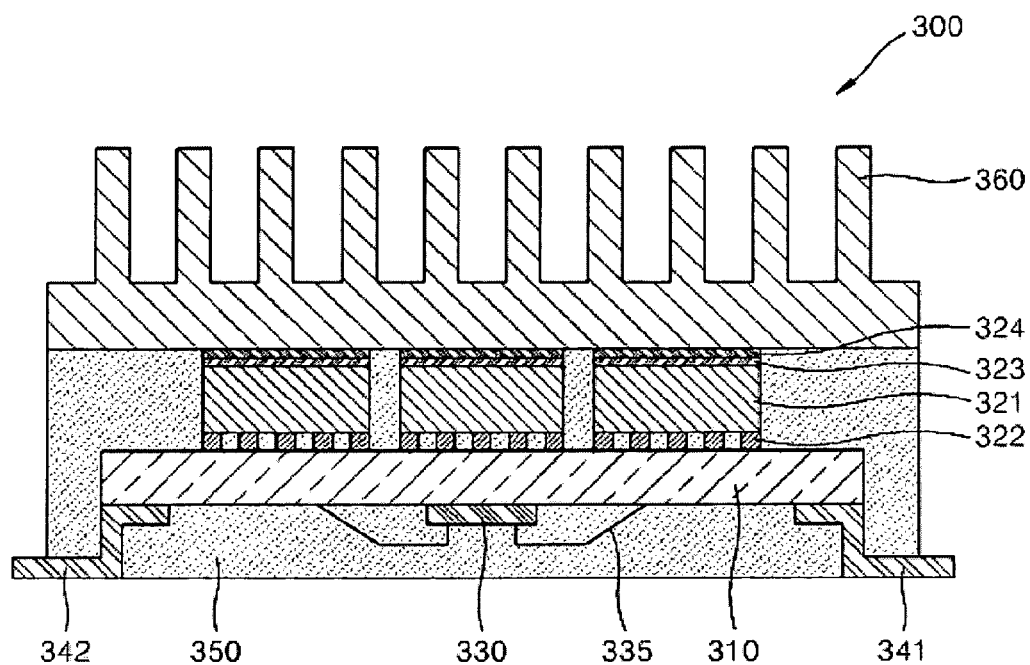
FIG. 3 is a cross-sectional view illustrating a multi-chip package according to another embodiment of the present invention.

FIG. 3 is a cross-sectional view illustrating a multi-chip package 300, according to another embodiment of the present invention.

Referring to FIG. 3, a semiconductor chip 321 is mounted on a top surface of a heat sink 360. The heat sink 360 is formed of a conductive material, e.g., copper. The semiconductor chip 321 may include a power device and/or a control device. The power device may be applied to, e.g., a motor drive, a power-inverter, a power-converter, a PFC or a display drive. However, the application examples of the power device are merely for describing the present invention, and the present invention is not limited thereto. The semiconductor chip 321 may include a silicon chip. In FIG. 3, a plurality of semiconductor chips 321 are illustrated, but the present invention is also applicable to the case of one semiconductor chip.

According to the current embodiment, an insulation layer 323 is interposed between a top surface of the heat sink 360 and the semiconductor chip 321. The insulation layer 323 can have high electrical resistance to insulate the semiconductor chip 321 and the heat sink 360 from each other. Also, the insulation layer 323 can have low thermal resistance, i.e., high thermal conductivity in order to efficiently release heat generated from the semiconductor chip 321 to the outside.

The insulation layer 323 may include a diamond layer. The diamond layer may be formed through a chemical vapor deposition method or a physical vapor deposition method.

For example, to form the diamond layer by the chemical vapor deposition method, a plasma vapor deposition method may be used under hydrogen gas atmosphere. To form the diamond layer by the physical chemical vapor method, a laser ablation method may be used. The laser ablation method can achieve a simple device structure and grow crystal even at a relatively low substrate temperature because of high kinetic energy of particles emitted from a graphite target.

The insulation layer 323 may include a BeO layer or an AlN layer. The BeO layer or the AlN layer may also be formed by the physical vapor deposition method or the chemical vapor deposition method.

Table 1 above shows various characteristics of diamond, BeO, AlN and Cu formed by the chemical vapor deposition method. Referring to Table 1, the diamond layer formed by the chemical vapor deposition method can serve as an insulation material because of its very high thermal resistance and can contribute to external heat release of a package because of its very high thermal conductivity. Accordingly, the insulation layer 323, according to the current embodiment, may include a diamond layer formed by the chemical vapor deposition method. However, those materials of the insulation layer 323 are merely exemplary, and the present invention is not limited thereto.

The multi-chip package 300 includes a substrate 310 on the semiconductor chips 321. The substrate 310 is electrically connected with the semiconductor chip 321. Examples of the substrate 310 may include a PCB, a FPCB, a DBC and IMS substrate, but the present invention is not limited to the described examples.

The semiconductor chip 321 and the substrate 310 may be electrically connected together by a bump 322 in a plurality of bumps formed on the semiconductor chip 321. The bump 322 may be formed of a metal or solder. The semiconductor chip 321 and the substrate 310 may be electrically connected by a bonding wire instead of the bump 322. If the bonding wire is used, a second metal layer (not shown) may be formed on the semiconductor chip 321.

A first metal layer 324 may be interposed between the top surface of the heat sink 360 and the insulation layer 323. For example, the first metal layer 324 can be used for soldering on the heat sink 360.

Another semiconductor chip is mounted on the substrate 310 and is electrically connected by a connection member 335. The additional semiconductor chip 330 may be a power device and/or a control device, but the present invention is not limited thereto.

The multi-chip package 300 includes an encapsulation material 350. The encapsulation material 350 may encapsulate the top surface of the heat sink 360, the semiconductor chips 321 and 230 and the substrate 310. The encapsulation material 350 may be an insulation resin, e.g., an EMC.

The multi-chip package in FIG. 3 can be formed using any suitable method. In one embodiment, the method includes providing a heat sink comprising a surface. The heat sink 360 can be formed using any suitable process, including etching or stamping.

After the heat sink 360 is formed, a plurality of semiconductor chips 321 is to the surface of the heat sink 360. Before the semiconductor chips 321 are attached to the heat sink 360, at least one of the layers 323, 324, 325 may be formed on the semiconductor chips 321 and/or the heat sink 360 using the deposition processes mentioned above, or other deposition processes know in the art.

Before or after the heat sink 360 is attached to the chips 321, a substrate 310 is attached to the plurality of semiconductor chips using the bumps 322.

After the heat sink 360 and the substrate 310 are attached to the chips 321, the heat sink 360, the plurality of semiconductor chips 321 and the substrate 310 can be encapsulated with an encapsulating material 350. Other elements, including elements 341, 342, 330, and 335 may be attached to the substrate 310 before encapsulation.

In other embodiments, everything except for the heat sink 360, is assembled together as shown in FIG. 3, and then the heat sink 360 may be attached to the assembled components.

Figure 4:
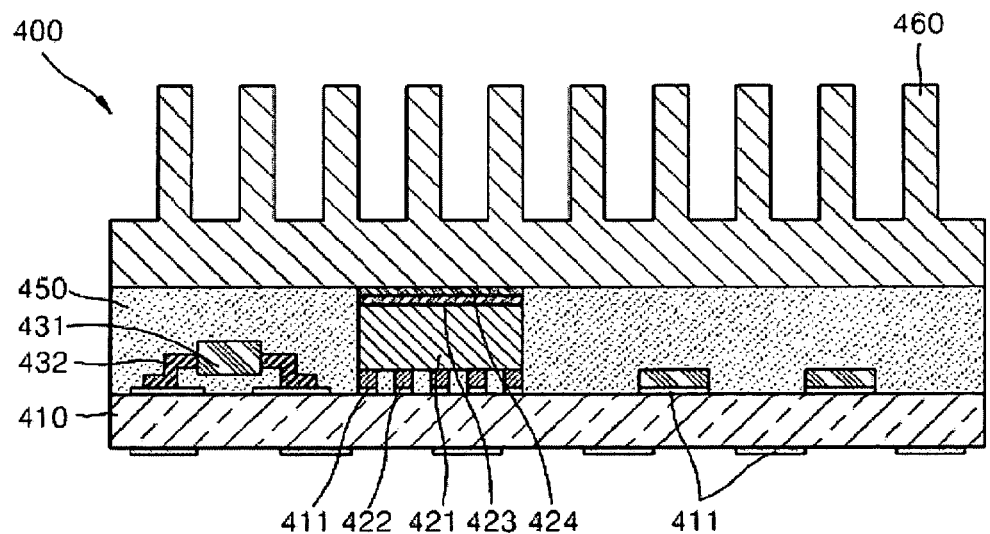
FIG. 4 is a cross-sectional view illustrating a multi-chip package according to another embodiment of the present invention.

FIG. 4 is a cross-sectional view illustrating a multi-chip package 400, according to an embodiment of the present invention.

Referring to FIG. 4, a semiconductor chip 421 is mounted to a surface of a heat sink 460. That heat sink 460 is formed of a thermally conductive material, e.g., Cu. The semiconductor chip 421 may include a power device and/or a control device. The power device may be applied to, e.g., a motor drive, a power-inverter, a power-converter, a PFC or a display drive. The application examples of the power device are merely for describing the present invention, and the present invention is not limited thereto. The semiconductor chip 421 may include a silicon chip. In FIG. 4, one semiconductor chip 421 is illustrated but the present invention is also applicable to the case of a plurality of semiconductor chips.

According to the current embodiment of the present invention, an insulation layer 423 is interposed between the top surface of the heat sink 460 and the semiconductor chip 421. The insulation layer 423 can have high electrical resistance to electrically insulate the semiconductor chip 460 and the heat sink 421 from each other. Also, the insulation layer 423 can also have low thermal resistance, i.e., high thermal conductivity to efficiently release heat generated from the semiconductor chip 421 to the outside.

The insulation layer 423 may include a diamond layer. The diamond layer may be formed through a chemical vapor deposition method or a physical vapor deposition method.

For example, to form the diamond layer by the chemical vapor deposition method, a plasma chemical vapor deposition method may be used under hydrogen gas atmosphere. To form the diamond layer by the physical vapor deposition method, a laser ablation method may be used. The laser ablation method can achieve a simple device structure and grow crystal even at a relatively low substrate temperature because of high kinetic energy of particles emitted from a graphite target.

The insulation layer 423 may include a BeO layer or an AlN layer. The BeO layer or the AlN layer may also be formed by the physical vapor deposition method or the chemical vapor deposition method.

Table 1 above shows various characteristics of diamond, BeO, AlN and Cu formed by the chemical vapor deposition method. Referring to Table 1, the diamond layer formed by the chemical vapor deposition method can serve as an insulation material because of its very high thermal resistance and can contribute to external heat release of the package because of its very high thermal conductivity. Accordingly, the insulation layer 423, according to the current embodiment, may include a diamond layer formed by the chemical vapor deposition method. However, those materials of the insulation layer 423 are merely exemplary, and the present invention is not limited thereto.

The multi-chip package 400 includes a substrate 410 on the semiconductor chip 421. The substrate 410 is electrically connected with the semiconductor chip 421. Examples of the substrate 410 may include an FPCB and a PCB having both sides on which traces 411 are formed, but the present invention is not limited thereto.

The semiconductor chip 421 and the substrate 410 may be electrically connected together by a bump 422 formed on the semiconductor chip 421. The bump 422 may be formed of a metal or solder.

A first metal layer 424 may be disposed between the top surface of the heat sink 460 and the insulation layer 423. For example, the first metal layer 424 comprise solder and can be used for soldering on the heat sink 460.

Another semiconductor chip 431 may be loaded on the trace 411 formed on the substrate 410 and is electrically connected by a connection member 432. Examples of another semiconductor chip 431 may be a power device and/or a control device, but the present invention is not limited thereto.

External electrical connection of the multi-chip package 400 can be made by the traces 411 provided on the substrate 410.

The multi-chip package 400 includes an encapsulation material 450. The encapsulation material 450 may encapsulate the top surface of the heat sink 460 and the semiconductor chips 421 and 431. The encapsulation material 450 may be an insulation resin, e.g., an EMC.

The embodiment in FIG. 4 can be formed in a similar manner as described above with reference to FIG. 3.

In the multi-chip packages 100 and 200 of FIGS. 1 and 2, the lead frame is exposed toward the heat sink. In the multi-chip packages 300 and 400 of FIGS. 3 and 4, the backside of the semiconductor chip 431 is exposed toward the heat sink.

Figure 5:
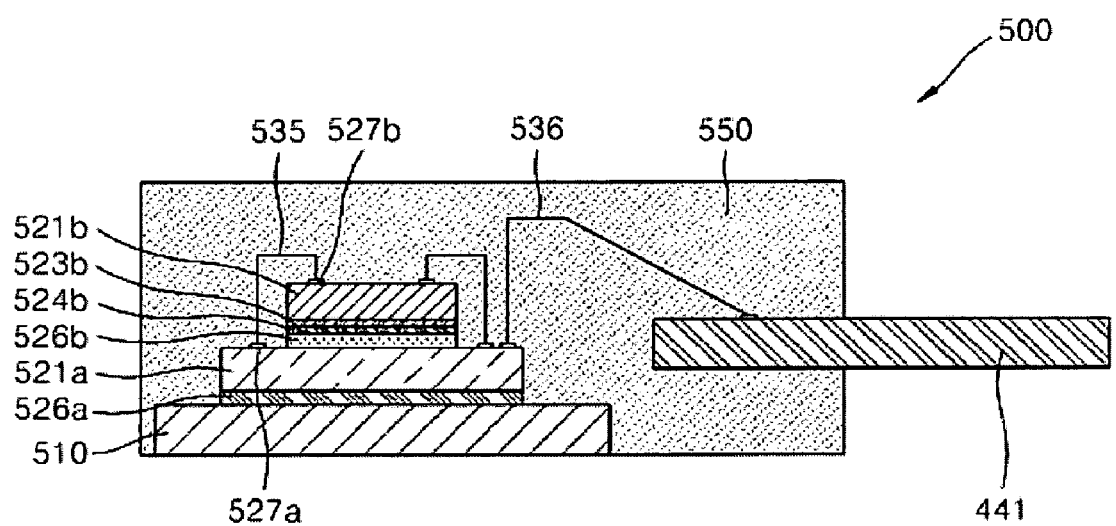
FIG. 5 is a cross-sectional view illustrating a multi-chip package according to another embodiment of the present invention.

FIG. 5 is a cross-sectional view illustrating a multi-chip package 500, according to another embodiment of the present invention.

Referring to FIG. 5, a first semiconductor chip 521a is mounted on a top surface of a first lead frame 510.

A second semiconductor chip 521b is also provided on a front surface of the first semiconductor chip 521a. The first semiconductor chip 521a and/or the second semiconductor chip 521b may include a power device and/or a control device. The power device may be applied to, e.g., a motor drive, a power-inverter, a power-converter, a PFC or a display drive. However, the application examples of the power device are merely for describing the present invention, and the present invention is not limited thereto. The first semiconductor chip 521a and/or the second semiconductor chip 521b may include a silicon chip.

An insulation layer 523b is interposed between the first semiconductor chip 521a and the second semiconductor chip 521b. In order to prevent a short between the first semiconductor chip 521a and the second semiconductor chip 521b, the insulation layer 523b can have high electrical resistance and thus electrically insulate the first semiconductor chip 521a and the second semiconductor 521b from each other. Also, the insulation layer 523b can also have low thermal resistance, high thermal conductivity to efficiently release heat generated from the semiconductor chip.

The insulation layer 523b may include a diamond layer. The diamond layer may be formed through a chemical vapor deposition method or a physical vapor deposition method.

For example, to form the diamond layer by the chemical vapor deposition method, a plasma chemical vapor deposition method may be used under hydrogen gas atmosphere. To form the diamond layer by the physical vapor deposition method, a laser ablation method may be used. The laser ablation method can achieve a simple device structure and grow crystal even at a relatively low substrate temperature because of high kinetic energy of particles emitted from a graphite target.

The insulation layer 523b may include a BeO layer or an AlN layer. The BeO layer or the AlN layer may also be formed by the physical vapor deposition method or the chemical vapor deposition method.

Table 1 above shows various characteristics of diamond, BeO, AlN and Cu formed by the chemical vapor deposition method. Referring to Table 1, the diamond layer formed by the chemical vapor deposition method can serve as an insulation material because of its very high thermal resistance and can contribute to external heat release of a package because of its very high thermal conductivity. Accordingly, the insulation layer 523b, according to the current embodiment, may include a diamond layer formed by the chemical vapor deposition method. However, those materials of the insulation layer 523b are merely exemplary, and the present invention is not limited thereto.

A first metal layer 524b may be interposed between the first semiconductor chip 521a and the insulation layer 523b. For example, the first metal layer 524b may be used for soldering.

A first die attach adhesive layer 526a may be provided between the first lead frame 510 and the first semiconductor chip 521a, and a second die attach adhesive layer 526b may be provided between the first semiconductor chip 521a and the second semiconductor chip 521b.

The first semiconductor chip 521a and the second semiconductor chip 521b may be electrically connected by a first bonding wire 535 (or other suitable bonding structure). As illustrated in FIG. 5, the first semiconductor chip 521a may have a larger lateral area than the second semiconductor chip 521b, such that surfaces of the first semiconductor chip 521a and the second semiconductor chip 521b that face in the same direction (e.g., upward) are electrically connected together with the wire 535.

A second lead frame 441 and a pad formed on the first semiconductor chip 521a and/or the second semiconductor chip 521b may be electrically connected together by a second bonding wire 536.

The multi-chip package 500 includes an encapsulation material 550. The encapsulation material 550 may encapsulate the first semiconductor chip 521a, the second semiconductor chip 521b, the insulation layer 523b and the bonding wires 535 and 536. The encapsulation material 550 may be an insulation resin, e.g., an EMC.

The package in FIG. 5 can be formed using any suitable method. In one embodiment, the method comprises mounting a first semiconductor chip 521a on a surface of a lead frame 510 using an adhesive 526a.

Before or after the lead frame 510 and the semiconductor chip 521a are attached together, a second semiconductor chip 521b is mounted on the first semiconductor chip 521a. Before the second semiconductor chip 521b is attached to the first semiconductor chip 521a, at least one of the layers 523b, 524b, 526b may be formed on the first semiconductor chip 521a and/or the second semiconductor chip 521b using the deposition processes mentioned above, or other deposition processes know in the art.

Then, the first semiconductor chip 521a and the second semiconductor chip 521b are electrically connected together using a bonding wire 535 or other suitable bonding structure such as a conductive clip.

After they are assembled together, the first semiconductor chip 521a, the second semiconductor chip 521b, and the bonding wire 535 are encapsulated with an encapsulating material. The other elements including elements 527a, 441, etc., may be assembled with other elements before encapsulation.

The multi-chip packages illustrated in FIGS. 1 through 4, semiconductor chips that are insulated from each other to prevent a short are disposed on a lead frame or a heat sink on a chip-by-chip basis. However, in the multi-chip package illustrated in FIG. 5, the semiconductor chips 521a and 521b insulated from each other are disposed on a chip-on-chip basis.

The multi-chip package, according to the present invention, can implement a package, including at least one semiconductor chip at a relatively low cost without using an insulation substrate.

In the multi-chip package, according to the present invention, a diamond layer having both high electrical resistance and low thermal resistance is disposed between a semiconductor chip and a lead frame or a heat sink, so that insulation between a plurality of semiconductor chips can be stably maintained, and external heat release can be performed effectively.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. Multi-chip package comprising:
    a lead frame comprising a surface;
    one or more semiconductor chips disposed on the surface of the lead frame but electrically isolated from the lead frame;
    an insulation layer interposed between the surface of the lead frame and the one or more semiconductor chips;
    a die attach adhesive layer disposed between the surface of the lead frame and the insulation layer;
    a substrate disposed on the plurality of semiconductor chips and electrically connected to the plurality of semiconductor chips; and
    an encapsulation material encapsulating the top surface of the lead frame, the one or more semiconductor chips and the substrate;
    wherein the encapsulation material exposes a bottom surface of the lead frame, and
    the multi-chip package further comprises a heat sink contacting the bottom surface of the lead frame.

2. The multi-chip package of claim 1, wherein the insulation layer comprises a diamond layer, a BeO layer or an AlN layer.

3. The multi-chip package of claim 2, wherein the diamond layer, the BeO layer or the AlN layer is formed by a chemical vapor deposition method or a physical vapor deposition method.

4. The multi-chip package of claim 1, further comprising a first metal layer disposed between the surface of the lead frame and the insulation layer.

5. The multi-chip package of claim 1, wherein the substrate comprises a printed circuit board (PCB) or a flexible printed circuit board (FPCB), and
    the multi-chip package further comprises a metal bump or a solder bump electrically connecting the substrate with the one or more semiconductor chips.

6. The multi-chip package of claim 1, wherein the one or more semiconductor chips comprises a plurality of silicon chips.

7. The multi-chip package of claim 1, further comprising another lead frame contacting the substrate and electrically connected to an external part.

8. A multi-chip package comprising:
    a heat sink comprising a surface;
    one or more semiconductor chips electrically insulated disposed on the surface of the heat sink, but electrically isolated from the heat sink;
    a substrate disposed on the one or more semiconductor chips and electrically connected to the one or more semiconductor chips;
    an encapsulation material encapsulating the surface of the heat sink, the one or more semiconductor chips and the substrate;
    an insulation layer interposed between the surface of the heat sink and the one or more semiconductor chips; and
    a first metal layer interposed between the surface of the heat sink and the insulation layer.

9. The multi-chip package of claim 8, wherein the insulation layer comprises a diamond layer, a BeO layer or an AlN layer.

10. The multi-chip package of claim 9, wherein the diamond layer, the BeO layer or the AlN layer is formed by a chemical vapor deposition method or a physical vapor deposition method.

11. The multi-chip package of claim 8, wherein the substrate comprises a printed circuit board (PCB) or a flexible printed circuit board (FPCB), and
    the multi-chip package further comprises a metal bump or a solder bump electrically connecting the substrate with the one or more semiconductor chips.

12. The multi-chip package of claim 8, wherein the one or more semiconductor chips comprises a plurality of silicon chips.

13. The multi-chip package of claim 8, further comprising a lead frame contacting the substrate and electrically connected with an external part.

14. A method for making a multi-chip package, the method comprising:
    providing a lead frame comprising a surface;
    attaching one or more semiconductor chips to the surface of a lead frame such that an insulation layer is interposed between the surface of the leadframe and the one or more semiconductor chips, and such that a die attach adhesive layer is disposed between the surface of the leadframe and the insulation layer, wherein the one or more semiconductor chips are electrically isolated from the lead frame;
    attaching a substrate to the one or more semiconductor chips;
    encapsulating the lead frame, the one or more semiconductor chips and the substrate with an encapsulating material such that the encapsulating material exposes a bottom surface of the lead frame; and
    attaching a heat sink to the bottom surface of the leadframe such that the heat sink contacts the bottom surface of the leadframe.

15. A method for making a multi-chip package comprising:
    providing a heat sink comprising a surface;
    attaching one or more semiconductor chips to the surface of the heat sink such that an insulation layer is interposed between the surface of the heat sink and the one or more semiconductor chips, and such that a first metal layer is interposed between the surface of the heat sink and the insulation layer, wherein the one or more semiconductor chips are electrically isolated from the heat sink;
    attaching a substrate to the one or more semiconductor chips; and
    encapsulating the heat sink, the one or more semiconductor chips and the substrate with an encapsulating material.

16. Multi-chip package comprising:
    a lead frame comprising a surface;
    one or more semiconductor chips disposed on the surface of the lead frame but electrically isolated from the lead frame;
    an insulation layer interposed between the surface of the lead frame and the one or more semiconductor chips;

a die attach adhesive layer disposed between the surface of the lead frame and the insulation layer;

a substrate disposed on the plurality of semiconductor chips and electrically connected to the plurality of semiconductor chips; and an encapsulation material encapsulating the top surface of the lead frame, the one or more semiconductor chips and the substrate.

17. The multi-chip package of claim 16, wherein the insulation layer comprises a diamond layer, a BeO layer or an AlN layer.

18. The multi-chip package of claim 17, wherein the diamond layer, the BeO layer or the AlN layer is formed by a chemical vapor deposition method or a physical vapor deposition method.

19. Multi-chip package comprising:

a first lead frame comprising a surface;

one or more semiconductor chips disposed on the surface of the first lead frame but electrically isolated from the first lead frame;

a substrate disposed on the plurality of semiconductor chips and electrically connected to the plurality of semiconductor chips;

an encapsulation material encapsulating the top surface of the first lead frame, the one or more semiconductor chips and the substrate; and a second lead frame contacting the substrate and electrically connected to an external part.

* * * * *